(12) United States Patent
Yih et al.

(10) Patent No.: US 7,244,661 B2
(45) Date of Patent: Jul. 17, 2007

(54) METHOD FOR FORMING A BURIED DIFFUSION LAYER WITH REDUCING TOPOGRAPHY IN A SURFACE OF A SEMICONDUCTOR SUBSTRATE

(75) Inventors: Cheng-Ming Yih, Hsin-Chu (TW); Huei-Huarng Chen, Chang-Hua (TW); Hsuan-Ling Kao, Taipei (TW)

(73) Assignee: Macronix International Co., Ltd., Hsin-Chu (TW)

( * ) Notice: Subject to any disclaimer, the term of this patent is extended or adjusted under 35 U.S.C. 154(b) by 362 days.

(21) Appl. No.: 11/032,045

(22) Filed: Jan. 11, 2005

(65) Prior Publication Data

US 2006/0154441 A1  Jul. 13, 2006

(51) Int. Cl.
*H01L 21/76* (2006.01)
(52) U.S. Cl. ............... 438/449; 438/439; 257/E21.551
(58) Field of Classification Search ............... 438/424, 438/439, 449; 257/E21.54, E21.551
See application file for complete search history.

(56) References Cited

U.S. PATENT DOCUMENTS 6,759,709 B1 *  7/2004  Shimizu ..................... 257/315

\* cited by examiner

*Primary Examiner*—Bradley Smith
(74) *Attorney, Agent, or Firm*—Birch, Stewart, Kolasch, and Birch, LLP

(57) ABSTRACT

A method for forming a buried diffusion layer with reducing topography in a surface of a semiconductor substrate is provided. A patterned first dielectric layer is formed on a semiconductor substrate for being used as a first hard mask. A thermal oxidation process is performed to form field oxides on the exposed potions of the semiconductor substrate. The patterned first dielectric layer is then removed. A second patterned dielectric layer is formed on the field oxides and the semiconductor substrate for being used as a second hard mask. An isotropic etching process is performed to etch the exposed portions of the field oxides and the semiconductor substrate. The patterned second dielectric layer and the underlying field oxides are removed to form a plurality of trenches on the surface of the semiconductor substrate. A buried diffusion layer is formed along surroundings of the trenches in the semiconductor substrate.

11 Claims, 10 Drawing Sheets

METHOD FOR FORMING A BURIED DIFFUSION LAYER WITH REDUCING TOPOGRAPHY IN A SURFACE OF A SEMICONDUCTOR SUBSTRATE

BACKGROUND OF THE INVENTION

1. Field of the Invention

The present invention relates to a method for forming a buried diffusion layer in a surface of a semiconductor substrate, and more particularly to a method for forming a buried diffusion layer having reducing topography in a semiconductor substrate.

2. Description of the Prior Art

To satisfy the demands for high integration, low cost and high-speed operation, both of a buried diffusion layer and a salicidation technology are utilized for fabricating semiconductor devices. For example, FIG. 1 is a top view of a conventional flash memory device, which is provided with buried diffusion layers and shallow trench isolation regions. A buried diffusion layer 12 is formed in a surface of a semiconductor substrate 10 to serve as source and drain regions of memory cells. A word line 14 is formed on the semiconductor substrate 10 adjacent to one side of the buried diffusion layer 12. And, a plurality of shallow trench isolation region 16 is formed in the semiconductor substrate 10 to isolate each memory cell.

FIG. 2 is a cross-sectional view of a unit memory cell 100 along line L—L of FIG. 1. The memory cell 100 includes a control gate 14, a floating gate 142, an interpoly oxide 144 between the control gate 14 and floating gate 142, and a gate oxide 140 under the floating gate 142. The drain region 12a is coupled to a bit line via a contact 18, and the source region 12b is connected to other sources region across shallow trench isolation regions 16 to couple to a common contact 20 to contact virtual ground devices (not shown) or to other structures for control of the voltage of the diffused source regions during erase, write, and read operations.

FIG. 3 is a cross-sectional view along line T—T of FIG. 1, the buried diffusion layer 12 served as source regions is coupled to a common contact 20 across the shallow trenches 16a. A salicide (not shown) is formed on the surfaces of the shallow trenches 16a adjacent to the buried diffusion layer 12 to reduce the resistance of the source regions. The depth of the shallow trench 16a is about 2000 to 5000 angstroms. Therefore, there will be some problems to be overcome when forming the buried diffusion layer 12 in the surface of the semiconductor substrate 10 along the surroundings of the shallow trenches 16a by way of ion implantation and forming the salicide on the surfaces of the shallow trenches 16a. For example, it is hard to implant ions into the steep sidewall of the shallow trench 16a. And, it is difficult to form the salicide on the sidewall of the shallow trench 16a due to poor step coverage.

Accordingly, it is an intention to provide a method for forming a buried diffusion layer with reducing topology in the surface of the semiconductor substrate, which can overcome the above drawbacks, and advantageously forming a salicide on the buried diffusion layer.

SUMMARY OF THE INVENTION

It is one objective of the present invention to provide a method for forming a buried diffusion layer with reducing topography in a surface of a semiconductor substrate, which utilizes a field oxide process to reduce topography of trenches following formed in a surface of the semiconductor substrate, thereby improving formation of a buried diffusion layer along the trenches in the semiconductor substrate.

It is another objective of the present invention to provide a method for forming a buried diffusion layer with reducing topography in a surface of a semiconductor substrate, which provides a buried diffusion layer with uniform distribution of dopants and let a salicide easily formed on the buried diffusion layer.

In order to achieve the above objectives, the present invention provides a method for forming a buried diffusion layer with reducing topography in a surface of a semiconductor substrate. A patterned first dielectric layer is formed on a semiconductor substrate for being used as a first hard mask. A thermal oxidation process is performed to form field oxides on the exposed potions of the semiconductor substrate. Removing the patterned first dielectric layer. A second patterned dielectric layer is formed on the field oxides and the semiconductor substrate for being used as a second hard mask. An isotropic etching process is performed to etch the exposed portions of the field oxides and the semiconductor substrate. Removing the patterned second dielectric layer and the underlying field oxides to form a plurality of trenches on the surface of the semiconductor substrate. A buried diffusion layer is formed along surroundings of the trenches in the semiconductor substrate.

The present invention provides a plurality of shallow trenches on the surface of the semiconductor substrate, which improves formation of a buried diffusion layer along the surroundings of the shallow trenches by ion implantation. A salicide is also easily formed on the sidewall of the shallow trenches adjacent to the buried diffusion layer to reduce resistance of the buried diffusion layer.

BRIEF DESCRIPTION OF THE DRAWINGS

The objectives and features of the present invention as well as advantages thereof will become apparent from the following detailed description, considered in conjunction with the accompanying drawings.

FIG. 5A to FIG. 9A is schematic cross-sectional views of various steps of the preferred embodiment along line A—A of FIG. 4;

FIG. 5B to FIG. 9B is schematic cross-sectional views of various steps of the preferred embodiment along line B—B of FIG. 4;

FIG. 5C to FIG. 8C is schematic cross-sectional views of various steps of the preferred embodiment along line 1—1 of FIG. 4; and FIG. 6D to FIG. 8D is schematic cross-sectional views of various steps of the preferred embodiment along line 2—2.

DESCRIPTION OF THE EMBODIMENTS

The present invention provides a field oxide process to reduce topography of shallow trenches following formed in a surface of a semiconductor substrate, thereby improving formation of a buried diffusion layer along the shallow trenches in the semiconductor substrate. A salicide is also easily formed along the sidewall of the shallow trenches adjacent to the buried diffusion layer.

Figure 1:
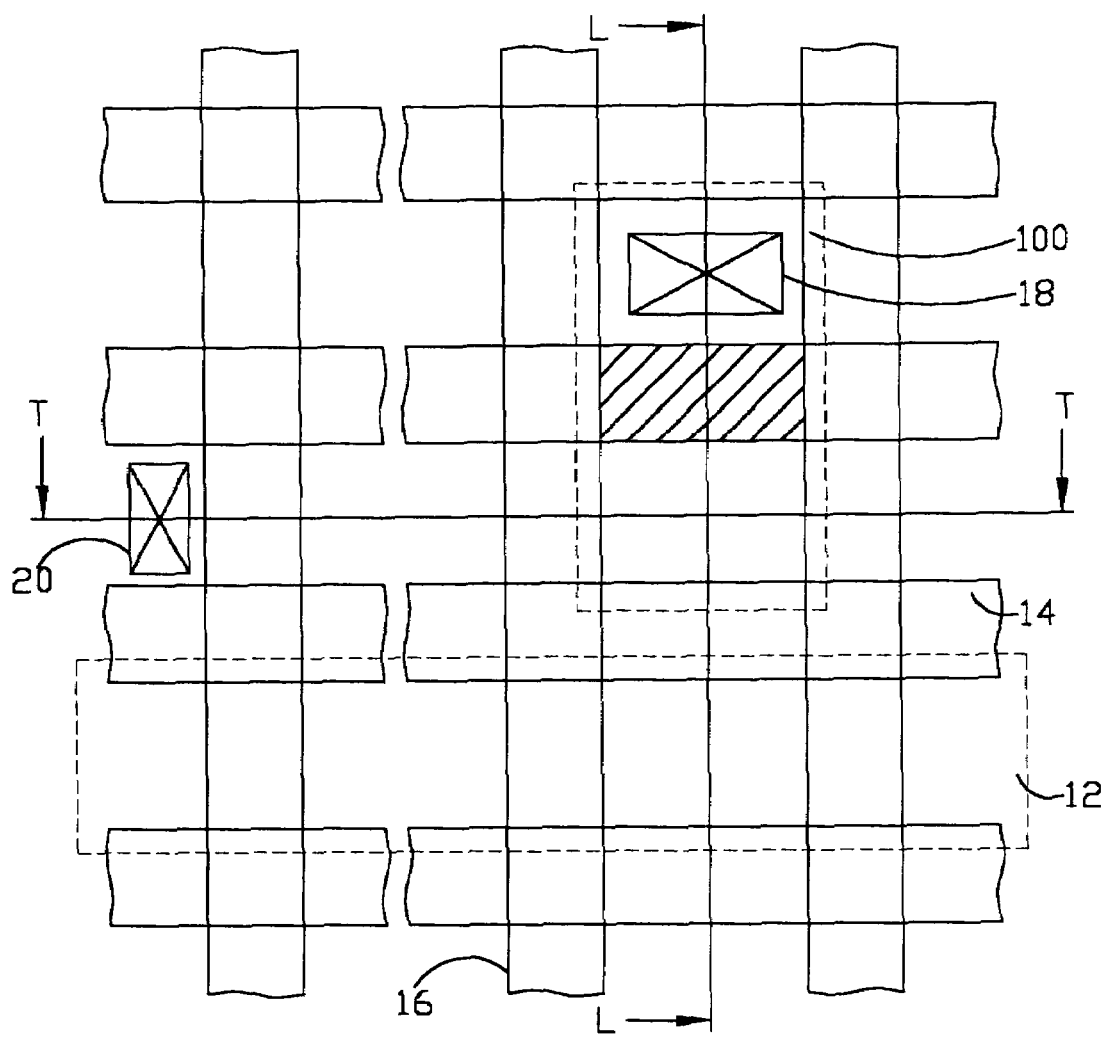
FIG. 1 is a schematic top view of a conventional flash memory device.
Figure 2:
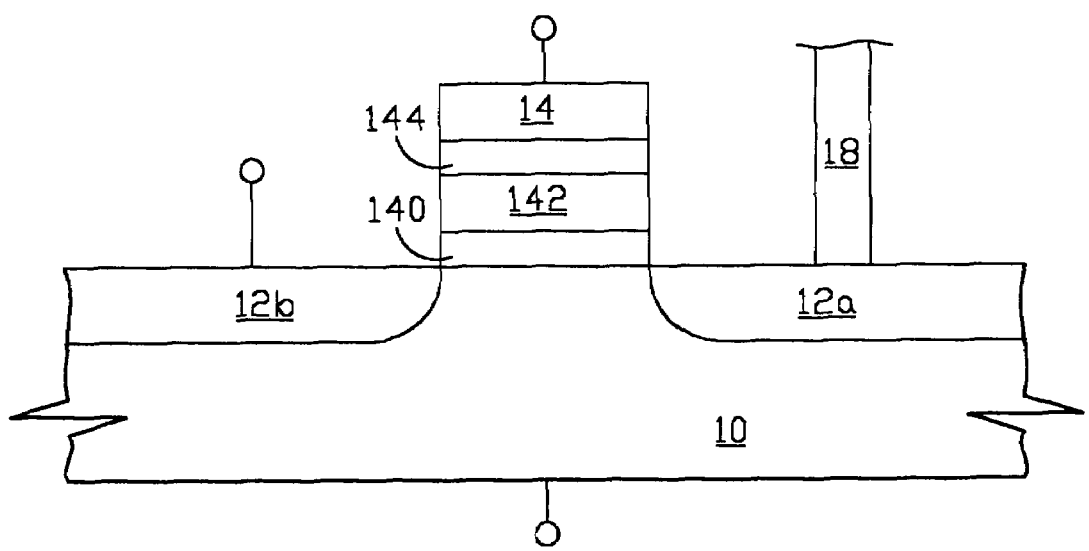
FIG. 2 is a schematic cross-sectional view of a unit memory cell of FIG. 1 along line L—L.
Figure 3:
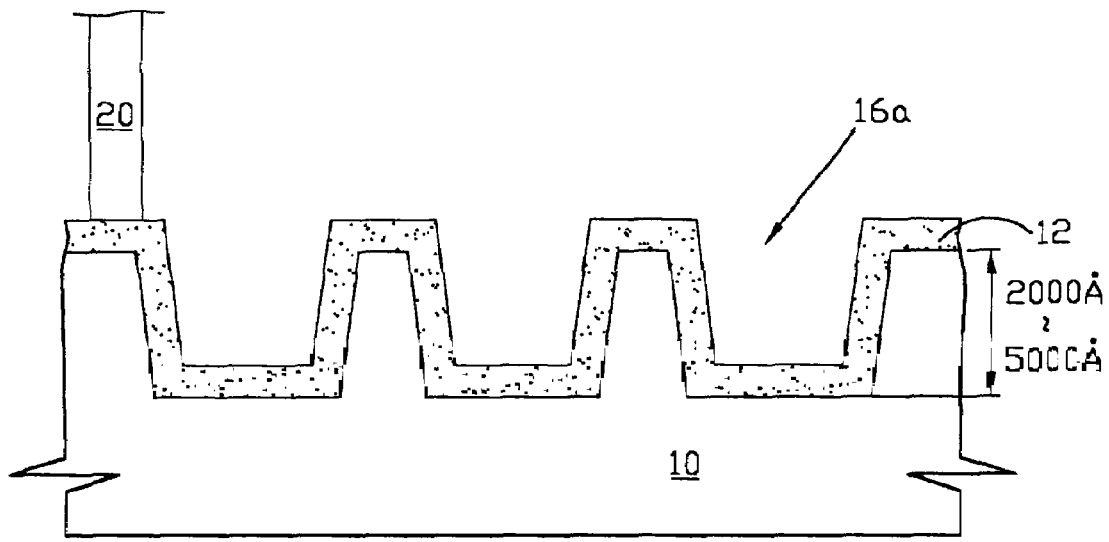
FIG. 3 is a schematic cross-sectional view along line T—T of FIG. 1.
Figure 4:
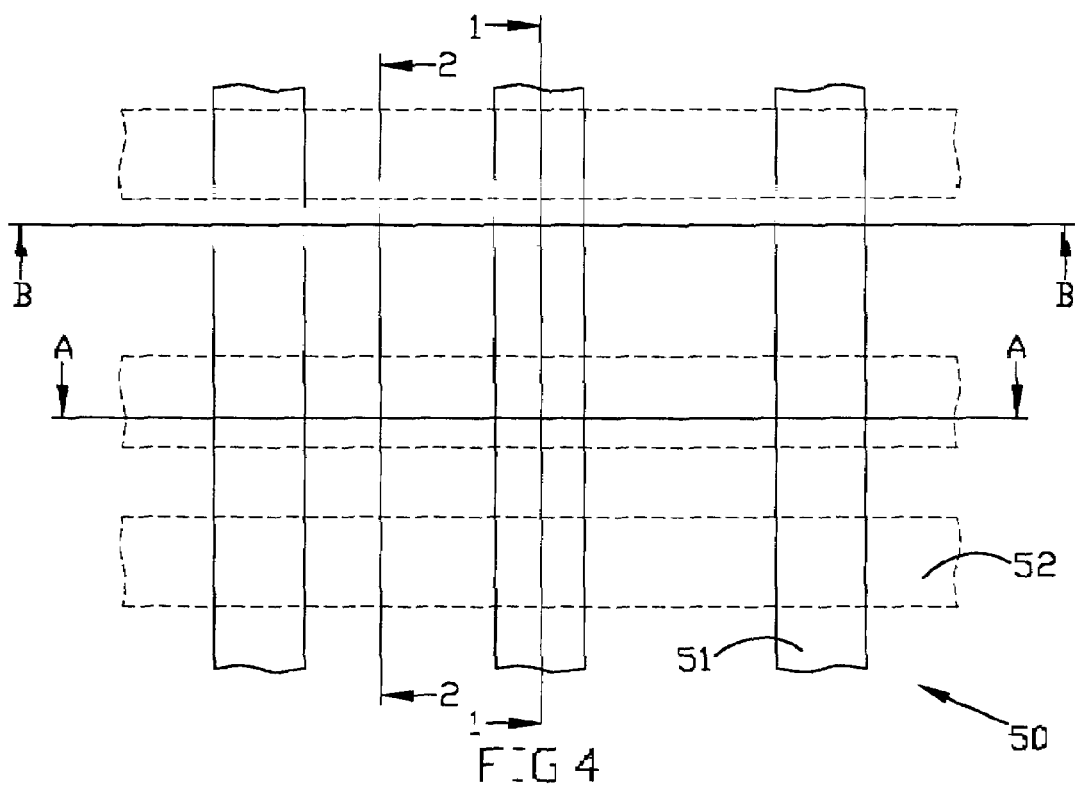
FIG. 4 is a schematic top view of a structure fabricated according to a preferred embodiment of the present invention.
Figure 5A:
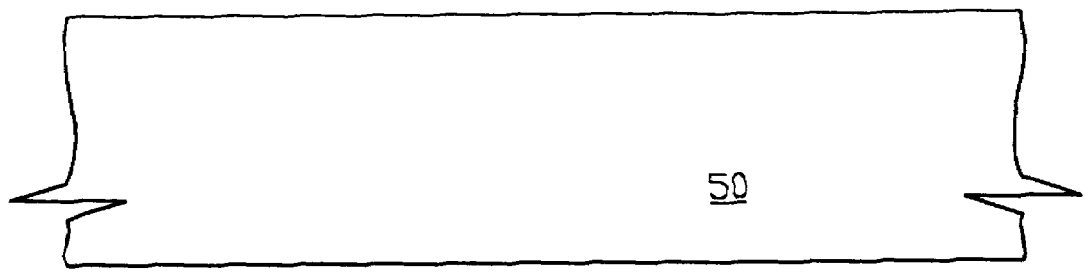
Figure 5B:
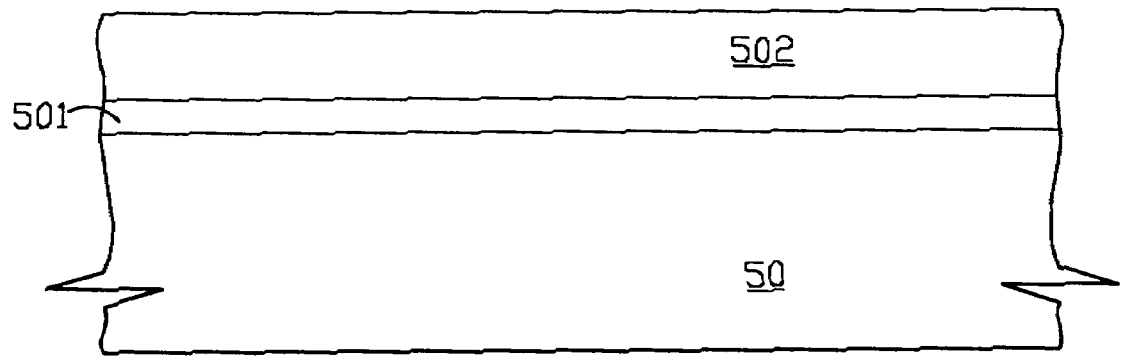
Figure 5C:
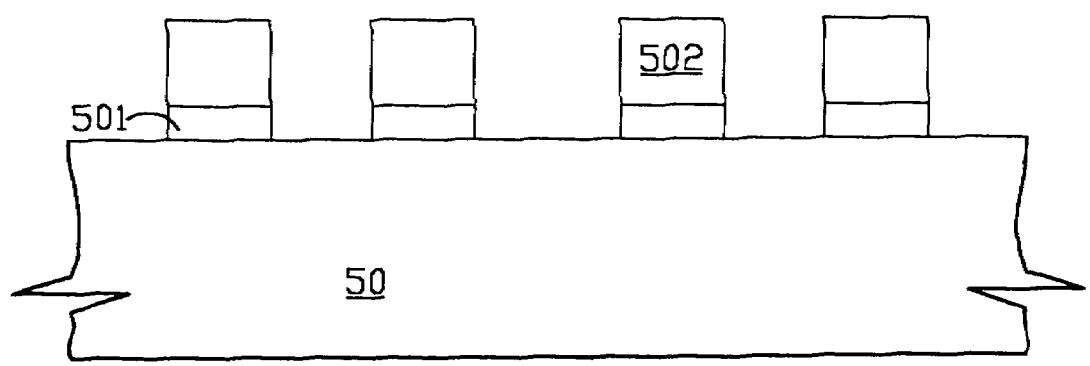
Figure 6A:
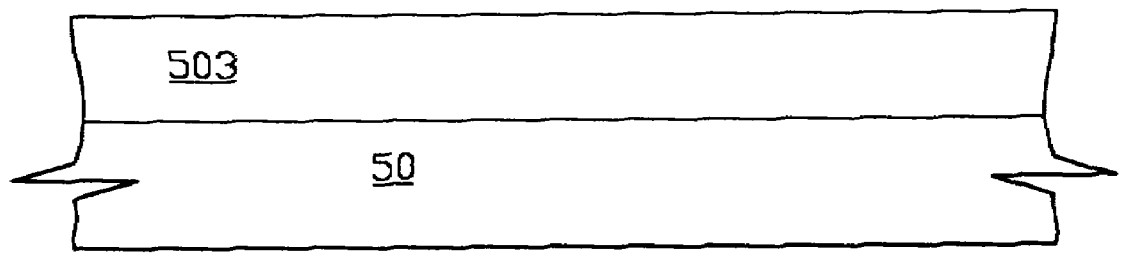
Figure 6B:
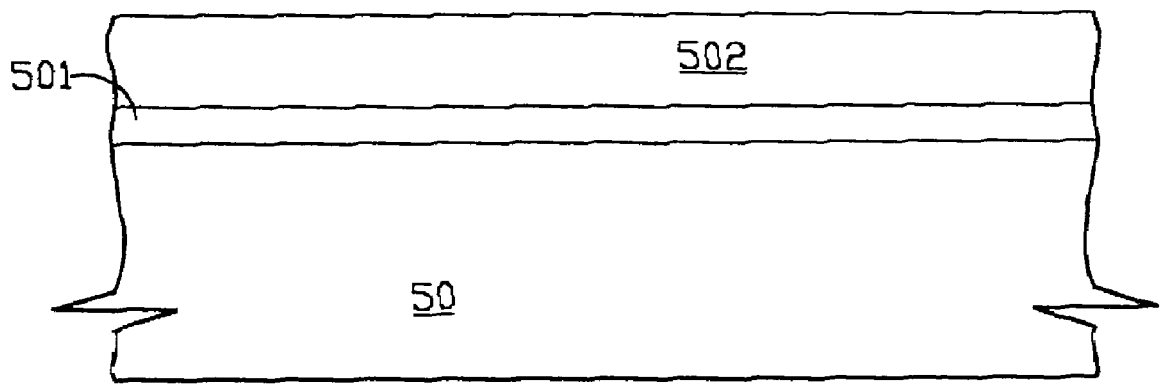
Figure 6C:
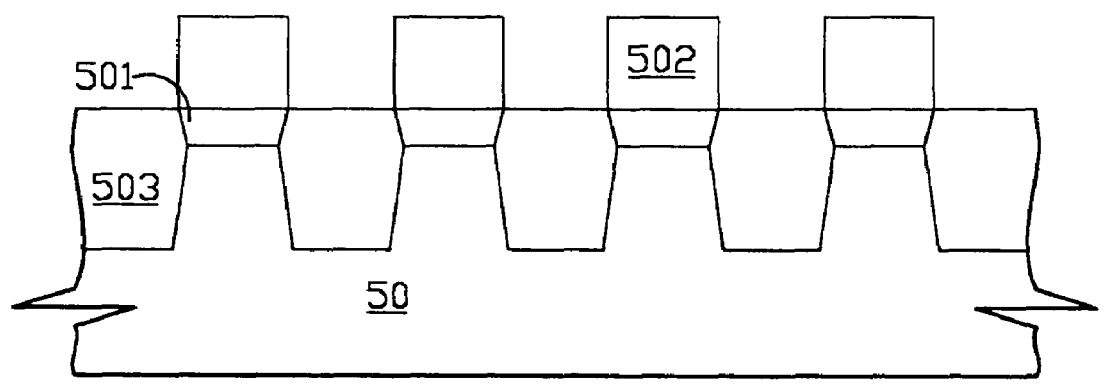
Figure 6D:
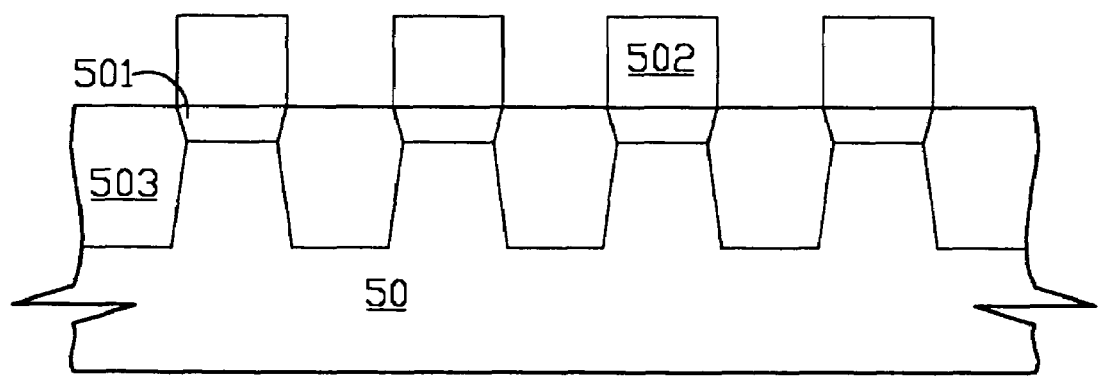
Figure 7A:
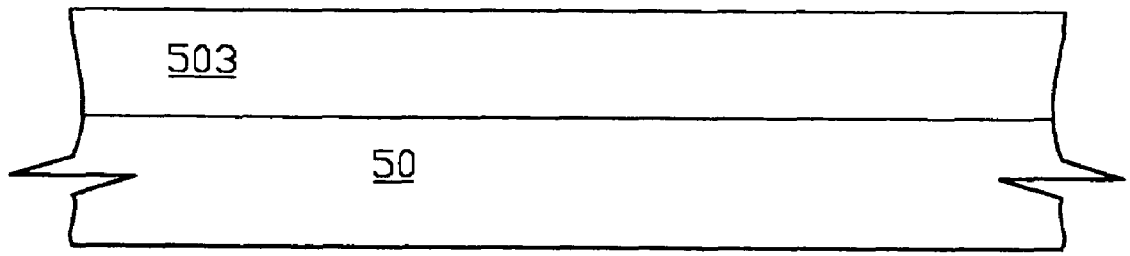
Figure 7B:
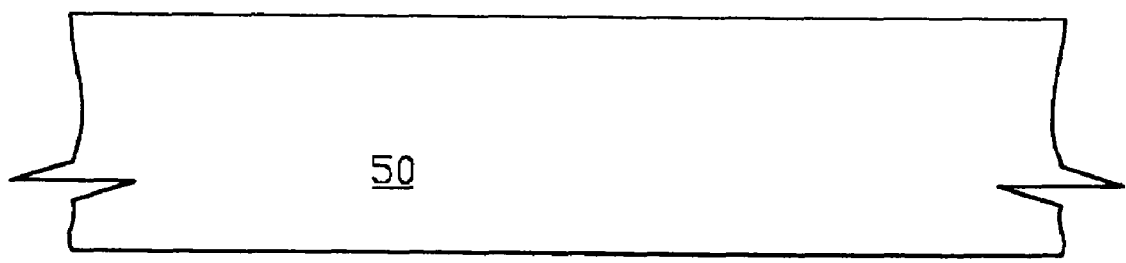
Figure 7C:
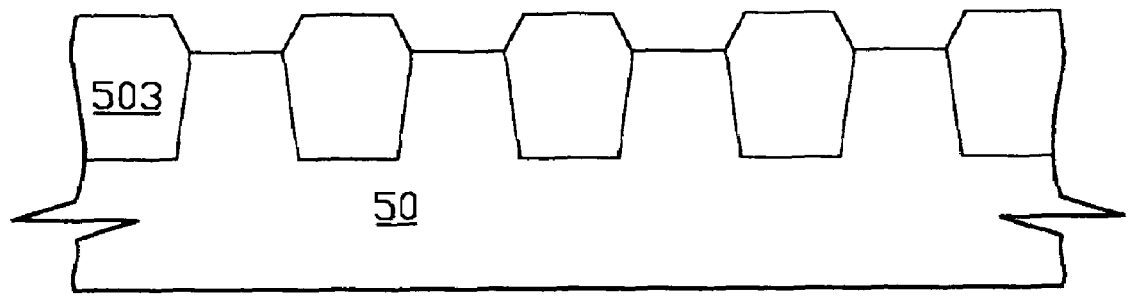
Figure 7D:
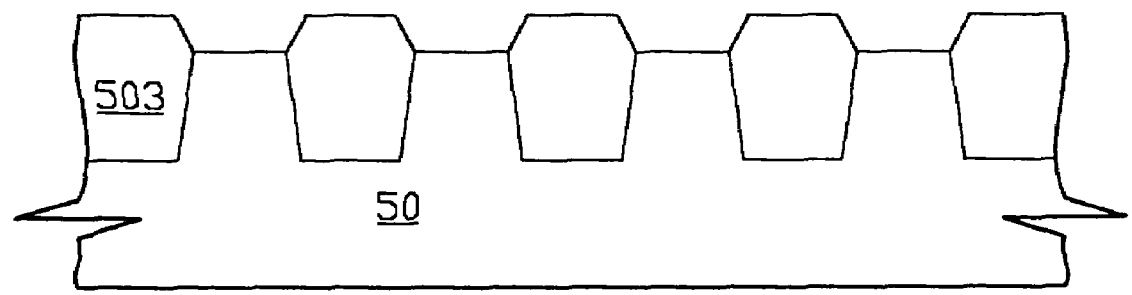
Figure 8A:
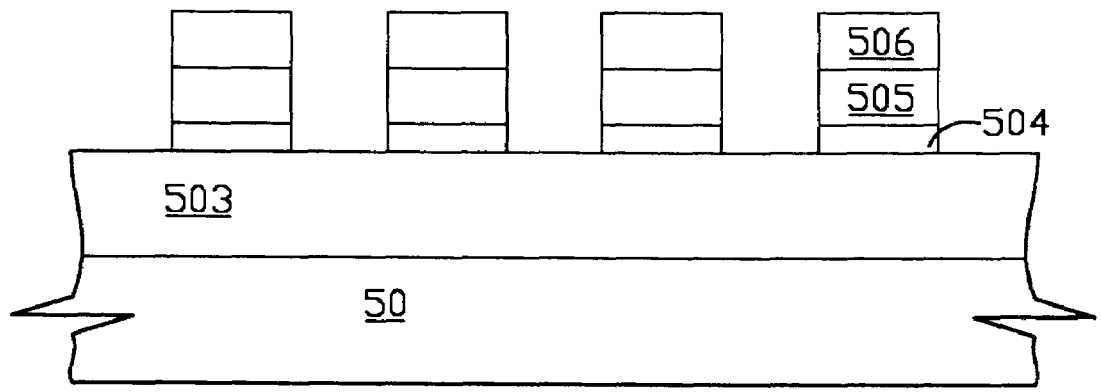
Figure 8B:
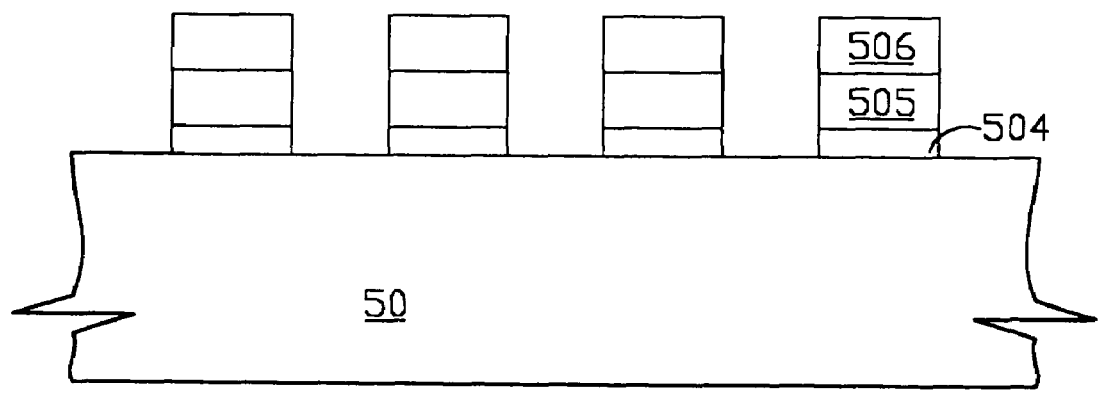
Figure 8C:
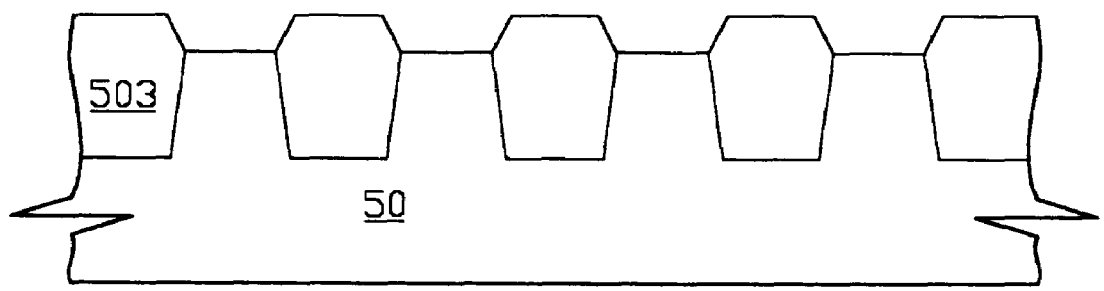
Figure 8D:
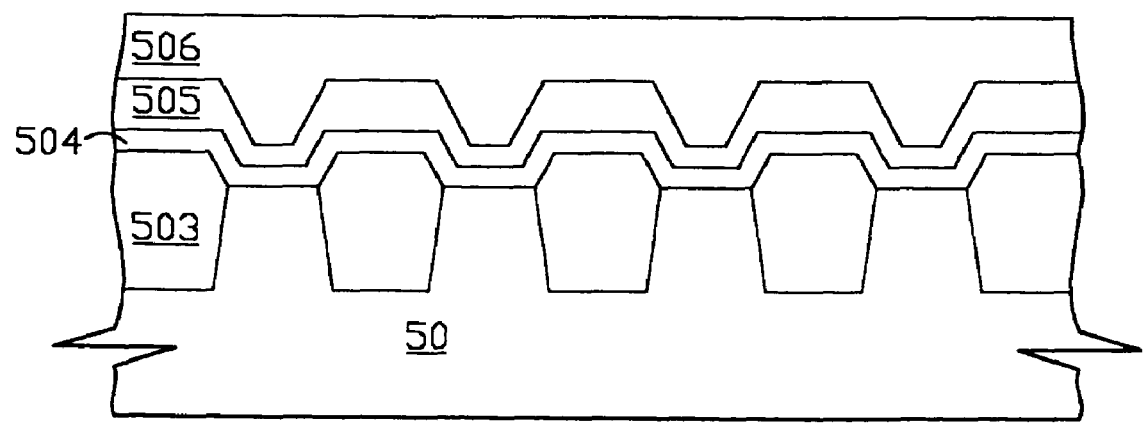
Figure 9A:
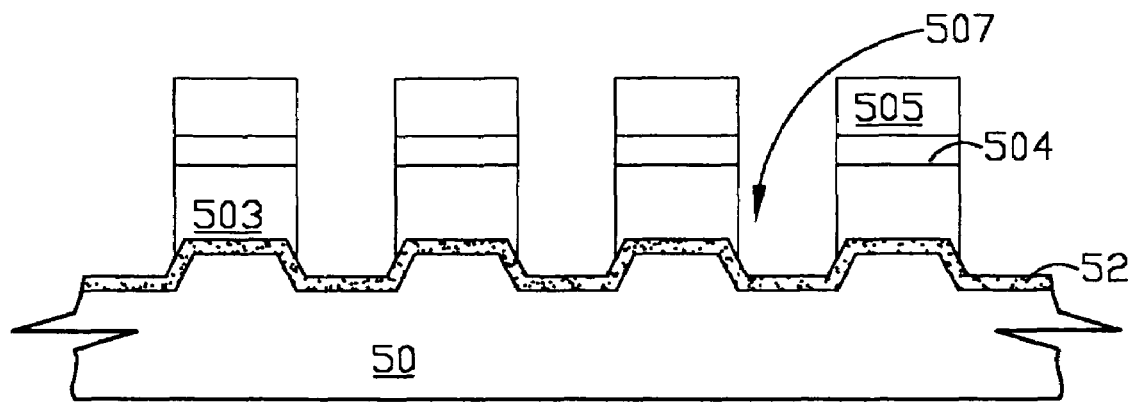
Figure 9B:
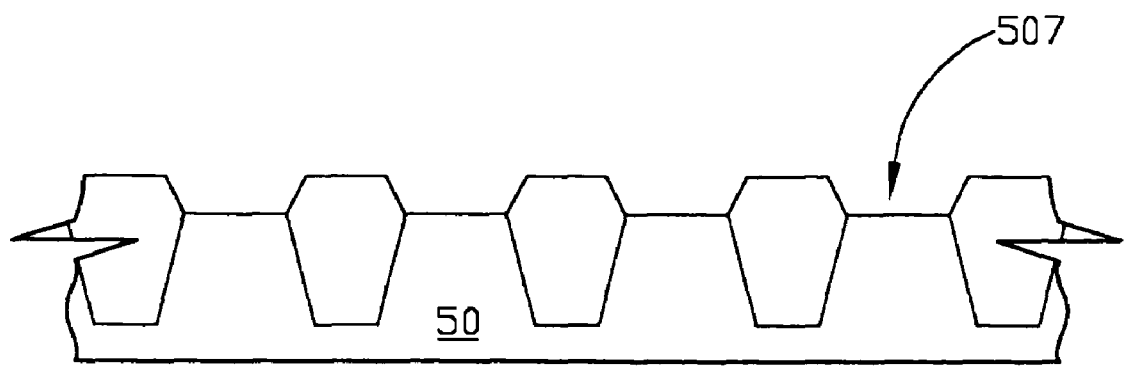

The present method will be described in detail according to one preferred embodiment of the present invention. FIG. 5A to FIG. 9B is schematic cross-sectional views of various steps of the preferred embodiment. FIG. 4 is a schematic top view of a structure provided by the preferred embodiment, in which a plurality of shallow trench isolation regions 51 is formed on the surface of a semiconductor substrate 50, and a plurality of buried diffusion layers 52 is formed in the surface of the semiconductor substrate 50 surrounding the shallow trench isolation regions 51. FIGS. 5A, 6A, 7A, 8A and 9A are schematic cross-sectional views of various steps of the preferred embodiment along line A—A of FIG. 4. FIGS. 5B, 6B, 7B and 8B are schematic cross-sectional views of various steps of the preferred embodiment along line B—B of FIG. 4. FIGS. 5C, 6C, 7C and 8C are schematic cross-sectional views of various steps of the preferred embodiment along line 1—1 of FIG. 4. And, FIGS. 6D, 7D and 8D are schematic cross-sectional views along line 2—2 of various steps of the preferred embodiment. Referring to FIG. 5A, a semiconductor substrate 50 with a first conductivity type is provided. The semiconductor substrate 50 can be a silicon substrate, germanium substrate and a germanium arsenic substrate. The first conductivity type can be either of N type and P type, which depends on whether an N-channel MOS (metal-oxide-semiconductor) transistor or a P-channel MOS transistor is desired. In case of the N-channel MOS transistor, a P type semiconductor substrate is provided. And, an N type semiconductor substrate is provided for the P-channel MOS transistor. Then, a hard mask layer is provided on the semiconductor substrate 50. Referring to FIG. 5B and FIG. 5C, a silicon oxynitride layer (SiON) 501 is formed on the semiconductor substrate 50 by way of a chemical vapor deposition method with reaction gases of $SiH_4$, $N_2O$ and $N_2$. Then, a silicon nitride layer 502 is formed on the silicon oxynitride layer 501 by way of a low pressure chemical vapor deposition method with reaction gases of $SiH_2Cl_2$ and $NH_3$ under a reaction pressure of about 0.1~1 torr and at a temperature of about 700~800° C. The silicon oxynitride layer 501 improves adherence between the silicon nitride layer 502 and the semiconductor substrate 50. Thereafter, the silicon oxynitride layer 501 and silicon nitride layer 502 are patterned by a conventional photolithography and etching method to form the hard mask layer on the semiconductor substrate 50. Referring to FIG. 6A to FIG. 6D, a thermal oxidation process is performed to form a plurality of LOCOS-type (local oxidation type) field oxides 503 in the surface of the semiconductor substrate 50 by using the patterned silicon oxynitride 501 and silicon nitride layer 502 as the hard mask layer. The thermal oxidation process can be a wet oxidation proceeding in an ambient of $H_2O$ or oxygen gases at a high temperature. Following, referring to FIG. 7A to FIG. 7D, the patterned silicon oxynitride layer 501 and silicon nitride layer 502 are removed by wet etching with $H_3PO_4$ aqueous solution. Then, a shallow trench isolation technology is applied on the whole semiconductor substrate 50. Referring to FIG. 8A to FIG. 8D, a silicon oxynitride layer (SiON) 504 is formed on the field oxides 503 and the silicon substrate 50 of the semiconductor by way of a chemical vapor deposition method with reaction gases of $SiH_4$, $N_2O$ and $N_2$. Then, a silicon nitride layer 505 is formed on the silicon oxynitride layer 504 by way of a low pressure chemical vapor deposition method with reaction gases of $SiH_2Cl_2$ and $NH_3$ under a reaction pressure of about 0.1~1 torr and at a temperature of about 700~800° C. The silicon oxynitride layer 504 improves adherence between the silicon nitride layer 505 and the field oxides 503. A photoresist layer 506 is applied onto the silicon nitride layer 505. Then, the silicon oxynitride layer 504 and silicon nitride layer 505 are patterned by a conventional photolithography and etching method to form the hard mask layer on the field oxides 503 and the semiconductor substrate 50. Thereafter, the photoresist layer 506 is removed. Referring to FIG. 9A and FIG. 9B, using the patterned silicon oxynitride layer 504 and silicon nitride layer 505 as an etching mask, an isotropic dry etching process, for example a reactive ion etching process, is performed to etch the exposed field oxides 503 and semiconductor substrate 50. As a consequence, a plurality of shallow trenches 507 with reduced topography is formed on the surface of the semiconductor substrate 50 along line A—A and line 1—1. The patterned field oxide 503, silicon oxynitride layer 504 and silicon nitride layer 505 are removed.

Referring to FIG. 9A again, an ion implantation process is performed to form a buried diffusion layer 52 with a second conductivity type opposite to the first conductivity type along the surroundings of the shallow trenches 507 in the surface of the semiconductor substrate 50. The buried diffusion layer 52 is served as source regions and drain regions of memory cells to be fabricated. $N^+$ type impurities such as phosphorous (P) with a dose of about $1\times10^{20}$ atoms/cm$^3$ can be implanted in the surroundings of the shallow trenches 507 to form the buried diffusion layer 52 for the memory cells of N-channel MOS transistors. On the contrary, $P^+$ type impurities such as $BF_2^+$ with a dose of about $1\times10^{20}$ atoms/cm$^3$ can be implanted in the surroundings of the shallow trenches 507 to form the buried diffusion layer 52 for the memory cells of P-channel MOS transistors. The shallow trenches 507 are provided with reduced topography by the present method. Thus, the impurities are advantageously implanted in the sidewalls of the shallow trenches 507. The salicide is also easily formed on the sidewalls of the shallow trenches 507 adjacent to the buried diffusion layer 52 to reduce the resistance thereof. By the present invention, a buried diffusion layer 52 with reducing topology formed in the surface of the semiconductor substrate 50 is provided.

The preferred embodiment is only used to illustrate the present invention, not intended to limit the scope thereof. Many modifications of the preferred embodiment can be made without departing from the spirit of the present invention.

What is claimed is:

1. A method for forming a buried diffusion layer with reducing topography in a surface of a semiconductor substrate, comprising:

providing a semiconductor substrate with a first conductivity type;

forming a first dielectric layer on said semiconductor substrate;

patterning said first dielectric layer to form a hard mask of said first dielectric layer on said semiconductor substrate;

performing a thermal oxidation process to form field oxides on the exposed potions of said semiconductor substrate;

removing said patterned first dielectric layer;

forming a second dielectric layer on said field oxides and said semiconductor substrate;

patterning said second dielectric layer to form a hard mask of said second dielectric layer;

performing an isotropic etching process to etch the exposed portions of said field oxides and said semiconductor substrate;

removing said patterned second dielectric layer and the underlying field oxides to form a plurality of trenches on the surface of said semiconductor substrate; and forming a buried diffusion layer with a second conductivity type opposite to the first conductivity type along surroundings of said trenches in said semiconductor substrate.

2. The method of claim 1, wherein said first dielectric layer comprises oxide or silicon oxynitride.

3. The method of claim 2, wherein further comprising a step of forming a silicon oxynitride layer on said semiconductor substrate prior to forming said first dielectric layer.

4. The method of claim 1, wherein said thermal oxidation process includes a wet oxidation process.

5. The method of claim 2, wherein said patterned first dielectric layer is removed by way of wet etching with $H_3PO_4$ aqueous solution.

6. The method of claim 1, wherein said second dielectric layer comprises silicon nitride.

7. The method of claim 6, wherein further comprising a step of forming a silicon oxynitride layer on said field oxides and said semiconductor substrate prior to forming said second dielectric layer.

8. The method of claim 1, wherein said buried diffusion layer is formed by way of ion implantation.

9. A method for forming a buried diffusion layer with reducing topography in a surface of a semiconductor substrate, comprising:

providing a semiconductor substrate with a first conductivity type;

forming a first silicon oxynitride layer on said semiconductor substrate;

forming a first silicon nitride layer on said first silicon oxynitride layer;

patterning said first silicon nitride layer and said first silicon oxynitride layer to form a first hard mask on said semiconductor substrate;

performing a thermal oxidation process to form field oxides on the exposed potions of said semiconductor substrate;

removing said first hard mask;

forming a second silicon oxynitride layer on said field oxides and said semiconductor substrate;

forming a second silicon nitride layer on said second silicon oxynitride layer;

patterning said second silicon oxynitride layer and said second silicon nitride layer to form a second hard mask on said field oxides and said semiconductor substrate;

performing an isotropic etching process to etch the exposed portions of said field oxides and said semiconductor substrate;

removing said second hard mask and the underlying field oxides to form a plurality of trenches on the surface of said semiconductor substrate; and forming a buried diffusion layer with a second conductivity type opposite to the first conductivity type along surroundings of said trenches in said semiconductor substrate.

10. The method of claim 9, wherein said thermal oxidation process includes a wet oxidation process.

11. The method of claim 9, wherein said buried diffusion layer is formed by way of ion implantation.

* * * * *